United States Patent
Yane et al.

(10) Patent No.: US 10,913,249 B2
(45) Date of Patent: Feb. 9, 2021

(54) ADHESIVE COMPOSITION USING POLYAMIDE-IMIDE RESIN

(71) Applicants: TOYOBO CO., LTD., Osaka (JP); NIPPON MEKTRON, LTD., Tokyo (JP)

(72) Inventors: Takehisa Yane, Shiga (JP); Hideyuki Koyanagi, Shiga (JP); Manabu Ohrui, Tokyo (JP); Satoshi Ebihara, Tokyo (JP)

(73) Assignees: TOYOBO CO., LTD., Osaka (JP); NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/780,739

(22) PCT Filed: Nov. 9, 2016

(86) PCT No.: PCT/JP2016/083155
§ 371 (c)(1),
(2) Date: Jun. 1, 2018

(87) PCT Pub. No.: WO2017/158917
PCT Pub. Date: Sep. 21, 2017

(65) Prior Publication Data
US 2018/0362815 A1    Dec. 20, 2018

(30) Foreign Application Priority Data
Mar. 15, 2016  (JP) .................................. 2016-051075

(51) Int. Cl.
*B32B 27/28*      (2006.01)
*C09J 179/08*    (2006.01)
(Continued)

(52) U.S. Cl.
CPC .............. *B32B 27/281* (2013.01); *B32B 7/12* (2013.01); *B32B 15/20* (2013.01); *C09J 179/08* (2013.01);
(Continued)

(58) Field of Classification Search
CPC ......... B32B 27/281; B32B 7/12; B32B 15/20; B32B 2250/03; B32B 2307/3065;
(Continued)

(56) References Cited

U.S. PATENT DOCUMENTS

2006/0247343 A1\* 11/2006 Kishimoto ........... C08K 5/5313
524/117
2007/0232727 A1\* 10/2007 Lin ........................ B82Y 30/00
523/440
(Continued)

FOREIGN PATENT DOCUMENTS

JP        2006-70176        3/2006
JP       2006265304 A   \*  10/2006
(Continued)

OTHER PUBLICATIONS

Machine translation of JP 2006265304. (Year: 2006).\*
(Continued)

*Primary Examiner* — John D Freeman
(74) *Attorney, Agent, or Firm* — Wenderoth, Lind & Ponack, L.L.P.

(57) ABSTRACT

The present invention provide an adhesive composition which is suitable for laminating a polyimide film with a copper foil in a double-sided flexible copper-clad laminate to be used for a flexible printed wiring board. The adhesive composition comprises a polyamide-imide resin, an epoxy resin, and a phosphorus-type flame retardant, wherein 15 to 40 parts by mass of the epoxy resin is compounded to 85 to 60 parts by mass of the polyamide-imide resin; a glass
(Continued)

transition temperature of the polyamide-imide resin is 250° C. or higher; an acid value of the polyamide-imide resin is 50 to 150 mgKOH/g; the epoxy resin is liquid at 25° C.; 15 to 60 parts by mass of the phosphorus-type flame retardant is compounded to 100 parts by mass in total of the polyamide-imide resin and the epoxy resin; and 50% by mass or more of the phosphorus-type flame retardant is a phosphinic acid derivative of a phenanthrene type.

9 Claims, 1 Drawing Sheet

(51) Int. Cl.
    *B32B 15/20*     (2006.01)
    *H05K 3/38*     (2006.01)
    *B32B 7/12*     (2006.01)

(52) U.S. Cl.
    CPC .......... *H05K 3/386* (2013.01); *B32B 2250/03* (2013.01); *B32B 2250/40* (2013.01); *B32B 2307/3065* (2013.01); *B32B 2457/08* (2013.01); *C09J 2463/00* (2013.01); *C09J 2479/08* (2013.01); *H05K 2201/012* (2013.01); *H05K 2201/0154* (2013.01)

(58) Field of Classification Search
    CPC ............ B32B 2250/40; B32B 2457/08; B32B 2307/732; B32B 2307/546; B32B 15/08; C08G 73/14; C09D 179/08; C09J 179/08; C09J 7/30; C09J 7/28; C09J 2463/00; C09J 2479/08; C09J 2479/00; C09J 2203/326; C09J 2400/163; H05K 3/386; H05K 2201/0358; H05K 3/022; H05K 2201/012; H05K 2201/0154; Y10T 428/31681; Y10T 428/31721

See application file for complete search history.

(56) References Cited

U.S. PATENT DOCUMENTS

| | | | | |
|---|---|---|---|---|
| 2013/0309489 | A1* | 11/2013 | Murakami | .............. C08L 79/08 428/355 CN |
| 2016/0152773 | A1* | 6/2016 | Murakami | ......... C08G 73/1035 522/170 |

FOREIGN PATENT DOCUMENTS

| | | | |
|---|---|---|---|
| JP | 2010-116443 | 5/2010 | |
| JP | 5480490 | 4/2014 | |
| JP | 5782583 | 9/2015 | |
| WO | WO-2010038644 A1 * | 4/2010 | .......... C08L 2666/22 |
| WO | 2015/182161 | 12/2015 | |

OTHER PUBLICATIONS

Machine translation of WO 2010/038644. (Year: 2010).*
International Preliminary Report on Patentability dated Sep. 18, 2018 in International (PCT) Application No. PCT/JP2016/083155.

* cited by examiner

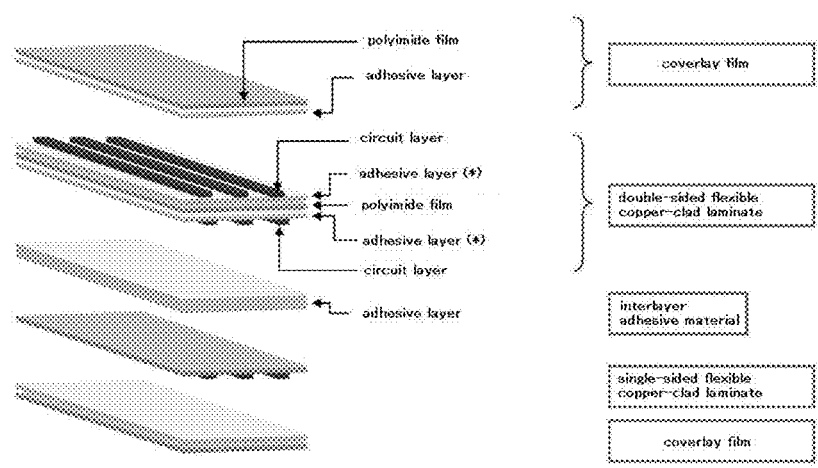

ADHESIVE COMPOSITION USING POLYAMIDE-IMIDE RESIN

TECHNICAL FIELD OF THE INVENTION

The present invention relates to an adhesive composition using a polyamide-imide resin. More particularly, the present invention relates to an adhesive composition which is excellent in a processing ability at low temperature, an adhesive property, a heat resistance, a flame retardancy and an electric insulation. Such adhesive composition can be suitably used in a double-sided flexible copper-clad laminate prepared by adhering a copper foil to each side of a polyimide film.

BACKGROUND ART

A flexible printed wiring board has been widely used in electronic instrument parts for which a flexibility and a space conservation are demanded such as a device substrate for displays (for example, liquid crystal displays, plasma displays, etc.), a substrate junction cable and a substrate for operating switches for mobile phones, digital cameras, portable game machines, etc. and an expansion to further applications has been expected.

In a flexible printed wiring board, there has been a progress in making the wirings highly dense in accordance with a tendency of making electronic instrument parts light, thin, short and small in recent years. An expansion of consumption has been expected for a single-sided flexible printed wiring board wherein a circuit layer consists of a single layer, a double-sided flexible printed wiring board wherein circuit layers consist of two layers, and a multiple-layered flexible printed wiring board wherein circuit layers consist of three or more layers.

Examples of the double-sided flexible printed wiring board and the multiple-layered flexible printed wiring board are shown in FIG. 1. FIG. 1 shows a double-sided flexible copper-clad laminate prepared by laminating copper foils working as circuit layers via an adhesive on both sides of an insulating film (polyimide film); and a type prepared by layering, on the double-sided flexible copper-clad laminate, a single-sided flexible copper-clad laminate via an adhesive.

The adhesive used for laminating the polyimide film with the copper foil in the double-sided flexible copper-clad laminate is applied to a substrate followed by drying and, after that, it is laminated to another substrate. Accordingly, there is no need to treat the adhesive as an adhesive film solely. Accordingly, it is not necessary to have a high level of flexibility which is required when the adhesive is made into the adhesive film. Moreover, it is not necessary to embed a difference in a level of the circuit layer. Also, a film thickness after drying the adhesive usually becomes 10 μm or less. Accordingly, it is not necessary to have a high level of low-warping property. In addition, the double-sided flexible copper-clad laminate is a base material which is firstly prepared in steps for manufacturing a flexible printed wiring board. Accordingly, it is necessary to be resistant to repeated heating and pressure connecting steps and reflow steps. As a result, it is necessary to have a high level of heat resistance and electric insulation. In summary, in the adhesive to be used for the double-sided flexible copper-clad laminate, a higher level of the heat resistance and electric insulation are demanded as compared with an interlayer adhesive, while some allowances are permitted for the flexibility and low-warping property.

As to an adhesive suitable as the interlayer adhesive, there has been proposed an adhesive composition comprising a polyamide-imide resin copolymerized with rubber ingredients (for example, see Patent Document 1). This adhesive composition is excellent in the flexibility, low-warping property, processing ability at low temperature, adhesive property and flame retardancy.

However, the adhesive composition of Patent Document 1 is insufficient in the heat resistance and electric insulation for using it in a double-sided flexible copper-clad laminate due to nitrile groups and ionic impurities contained in the rubber ingredients.

Also, as to an adhesive suitable for a flexible copper-clad laminate, there has been proposed an adhesive layer comprising a specific thermoplastic polyimide resin (for example, see Patent Document 2). This adhesive layer is excellent in the adhesive property, heat resistance, flame retardancy and electric insulation.

However, the thermoplastic polyimide resin used in this adhesive layer needs to be melted at a high temperature of 300° C. or higher for expressing the adhesive property. Therefore, there is a problem in the processing ability at low temperature. When a copper foil is processed at the high temperature of 300° C. or higher, there is a tendency to cause a lowering of a quality such as a poor appearance due to oxidation and a dislocation due to flexure.

As mentioned above, in the art which has been proposed already, it is difficult to obtain an adhesive which is suitable for a double-sided flexible copper-clad laminate and which satisfies all of the processing ability at low temperature, adhesive property, heat resistance, flame retardancy and electric insulation in a high level.

PRIOR ART DOCUMENTS

Patent Documents

Patent Document 1: Japanese Patent No. 5782583
Patent Document 2: Japanese Patent No. 5480490

DISCLOSURE OF THE INVENTION

Problem that the Invention is to Solve

The present invention has been achieved for solving the above-mentioned problems in the prior art. An object of the present invention is to provide an adhesive composition which is suitable for laminating a polyimide film with a copper foil in a double-sided flexible copper-clad laminate to be used for a flexible printed wiring board.

Means for Solving the Problem

The inventors have conducted eager investigations for achieving the above object. As a result, they have found that, by using an adhesive composition comprising a specific polyamide-imide resin, an epoxy resin which is liquid at 25° C. and a specific phosphorus-type flame retardant being excellent in a plastic effect in a specific ratio, it is now possible to obtain an adhesive composition having characteristics which are suitable as an adhesive to be used for a double-sided flexible copper-clad laminate whereupon the present invention has been achieved.

Thus, the present invention consists of the constitutions of the following (1) to (9).

(1) An adhesive composition comprising a polyamide-imide resin, an epoxy resin, and a phosphorus-type flame retardant, characterized in that said adhesive composition has characteristics of the following (A) to (F):

(A) 15 to 40 parts by mass of the epoxy resin is compounded to 85 to 60 parts by mass of the polyamide-imide resin;

(B) a glass transition temperature of the polyamide-imide resin is 250° C. or higher;

(C) an acid value of the polyamide-imide resin is 50 to 150 mgKOH/g;

(D) the epoxy resin is liquid at 25° C.;

(E) 15 to 60 parts by mass of the phosphorus-type flame retardant is compounded to 100 parts by mass in total of the polyamide-imide resin and the epoxy resin; and (F) 50% by mass or more of the phosphorus-type flame retardant is a phosphinic acid derivative of a phenanthrene type.

(2) The adhesive composition according to (1), wherein the polyamide-imide resin contains trimellitic acid anhydride as an acid ingredient.

(3) The adhesive composition according to (1) or (2), wherein the adhesive composition is used for adhering a copper foil with a polyimide film.

(4) A copper foil equipped with an adhesive layer, characterized in that the adhesive layer comprises the adhesive composition according to any of (1) to (3).

(5) The copper foil equipped with an adhesive layer according to (4), wherein an amount of residual solvent in the adhesive layer of the copper foil equipped with an adhesive layer in a state of B stage is 5.0 to 16.0% by mass.

(6) The copper foil equipped with an adhesive layer according to (4) or (5), wherein the foil can be laminated at a laminating temperature of 150° C. or lower.

(7) A double-sided flexible copper-clad laminate, characterized in that the laminate is prepared by adhering a copper foil to each side of a polyimide film and that the copper foil is the copper foil equipped with the adhesive layer according to any of (4) to (6).

(8) A flexible printed wiring board, characterized in that the board comprises the double-sided flexible copper-clad laminate according to (7).

Advantages of the Invention

The polyamide-imide resin used in the adhesive composition of the present invention has a high glass transition temperature and is excellent in a heat resistance, a flame retardancy and an electric insulation. In addition, the polyamide-imide resin used in the adhesive composition of the present invention has a high acid value, and thus an amount of epoxy group does not become excessive and properties are not deteriorated even when an epoxy resin is abundantly compounded. Moreover, when this polyamide-imide resin is combined with an epoxy resin being liquid at 25° C. and a specific phosphorus-type flame retardant being excellent in a thermoplastic effect, the resulting adhesive composition is excellent in a processing ability at low temperature and an adhesive property in addition to the heat resistance, the flame retardancy and the electric insulation. This adhesive composition is very suitable for laminating a polyimide film of the double-sided flexible copper-clad laminate with a copper foil at 150° C. or lower.

BRIEF DESCRIPTION OF THE DRAWINGS

FIG. 1 shows a schematic constitution of an example of a multi-layered flexible printed wiring board. In this drawing, an adhesive layer (*) is a part wherein the adhesive composition of the present invention is advantageously used.

BEST MODE FOR CARRYING OUT THE INVENTION

The polyamide-imide resin used in the adhesive composition of the present invention has the characteristics of the following (a) to (b):

(a) a glass transition temperature of the polyamide-imide resin is 250° C. or higher, preferably 255° C. or higher, and more preferably 260° C. or higher; and (b) an acid value of the polyamide-imide resin is 50 to 150 mgKOH/g, preferably 50 to 130 mgKOH/g, and more preferably 60 to 120 mgKOH/g.

The above-mentioned glass transition temperature of the polyamide-imide resin of the present invention is selected in view of a heat resistance demanded in an actual use. The above-mentioned acid value of the polyamide-imide resin of the present invention is a numerical value range which is higher than usual and is selected in such a view that, even when the epoxy resin is abundantly compounded, the resulting adhesive composition is excellent in a heat resistance and an insulating property.

As to an acid ingredient used in the polyamide-imide resin of the present invention, an anhydride of polycarboxylic acid having an aromatic group is preferred. As to the polycarboxylic acid having an aromatic group, there may be exemplified trimellitic acid anhydride (TMA), pyromellitic acid dianhydride (PMDA), 3,3',4,4'-benzophenone-tetracarboxylic acid dianhydride (BTDA), 3,3',4,4'-biphenyl-tetracarboxylic acid dianhydride (BPDA), alkylene glycol bisanhydrotrimellitate (such as ethylene glycol bisanhydrotrimellitate (TMEG), propylene glycol bisanhydrotrimellitate, 1,4-butanediol bisanhydro-trimellitate, hexamethylene glycol bisanhydrotrimellitate, polyethylene glycol bisanhydrotrimellitate and polypropylene glycol bisanhydrotrimellitate), 1,2,5,6-naphthalene-tetracarboxylic acid dianhydride, 1,4,5,8-naphthalene-tetracarboxylic acid dianhydride, 2,3,5,6-pyridine-tetracarboxylic acid dianhydride, 3,4,9,10-perylene-tetracarboxylic acid dianhydride, 3,3',4,4'-diphenylsulfone-tetracarboxylic acid dianhydride, 4,4'-oxydiphthalic acid dianhydride, 1,1,1,3,3,3-hexafluoro-2,2-bis(2,3- or 3,4-dicarboxyphenyl)propane dianhydride, 2,2-bis(2,3- or 3,4-dicarboxyphenyl)propane dianhydride, 2,2-bis[4-(2,3- or 3,4-dicarboxyphenoxy)phenyl]propane dianhydride, 1,1,1,3,3,3-hexafluoro-2,2-bis[4-(2,3- or 3,4-dicarboxyphenoxy)phenyl]propane dianhydride and 1,3-bis (3,4-dicarboxylphenyl)-1,1,3,3-tetramethyldisiloxane dianhydride. Each of them may be used solely or two or more thereof may be used jointly. Further, a rate of the polycarboxylic acid having an aromatic group in the total acid ingredients is preferred to be 80 mol % or higher, is more preferred to be 90 mol % or higher and may be 100 mol %.

It is also possible to use aliphatic or alicyclic acid anhydrides and aromatic, aliphatic or alicyclic dicarboxylic acids as other acid ingredients within such an extent that they do not deteriorate the effect of the present invention. For example, there may be listed a compound wherein any of the above-mentioned ingredients is hydrogenated, meso-butane-1,2,3,4-tetra-carboxylic acid dianhydride, pentane-1,2,4,5-tetracarboxylic acid dianhydride, cyclobutane-tetracarboxylic acid dianhydride, cyclopentane-tetracarboxylic acid dianhydride, cyclohex-1-ene-2,3,5,6-tetracarboxylic acid dianhydride, 3-ethylcyclohex-1-ene-3-(1,2),5,6-tetracarboxylic acid dianhydride, 1-methyl-3-ethylcyclohexane-3-(1,2), 5,6-tetra-carboxylic acid dianhydride, 1-methyl-3-ethylcyclohex-1-ene-3-(1,2),5,6-tetracarboxylic acid dianhydride, 1-ethylcyclo-hexane-1-(1,2),3,4-tetracarboxylic acid dianhydride, 1-propylcyclohexane-1-(2,3),3,4-tetracarboxylic acid dianhydride, 1,3-dipropylcyclohexane-1-(2,3),3-(2,3)-tetra-carboxylic acid dianhydride, dicyclohexyl-3,4,3',4'-tetra-carboxylic acid dianhydride, bicyclo[2.2.1]heptane-2,3,5,6-tetracarboxylic acid dianhydride, 1-propylcyclohexane-1-(2,3),3,4-tetracarboxylic acid dianhydride, 1,3-dipropyl-cyclohexane-1-(2,3), 3-(2,3) -tetracarboxylic acid dianhydride, dicyclohexyl-3,4,3',4'-tetracarboxylic acid dianhydride, bicyclo[2.2.1]heptane-2,3,5,6-tetracarboxylic acid dianhydride, bicyclo[2.2.2]octane-2,3,5,6-tetracarboxylic acid dianhydride, bicyclo[2.2.2]oct-7-ene-2,3,5,6-tetra-carboxylic acid dianhydride, cyclohexane dicarboxylic acid, terephthalic acid, isophthalic acid, orthophthalic acid, naphthalene dicarboxylic acid and oxydibenzoic acid. Each of them may be used solely or two or more thereof may be used jointly. In view of the heat resistance of the resulting polyamide-imide resin and of the flame retardancy of the adhesive composition using the same, a rate of the above ingredient in the total acid ingredients is preferred to be 20 mol % or less.

As to a diisocyanate or diamine ingredient used in the polyamide-imide resin of the present invention, diisocyanate or diamine having an aromatic group is preferred. Examples of the diisocyanate having an aromatic group are diphenylmethane 2,4'-diisocyanate, diphenylmethane 4,4'-diisocyanate, 3,2'- or 3,3'- or 4,2'- or 4,3'- or 5,2'- or 5,3'- or 6,2'- or 6,3'-dimethyldiphenyl- methane 2,4'-diisocyanate, 3,2'- or 3,3'- or 4,2'- or 4,3'- or 5,2'- or 5,3'- or 6,2' or 6,3'-diethyldiphenylmethane 2,4'-diisocyanate, 3,2'- or 3,3'- or 4,2'- or 4,3'- or 5,2'- or 5,3'- or 6,2'- or 6,3'-dimethoxydiphenylmethane 2,4'-diisocyanate, diphenylmethane 4,4'-diisocyanate, diphenylmethane 3,3'-diisocyanate, diphenylmethane 3,4'-diisocyanate, diphenyl ether 4,4'-diisocyanate, benzophenone 4,4'-diisocyanate, diphenylsulfone 4,4'-diisocyanate, tolylene 2,4-diisocyanate, tolylene 2,6-diisocyanate, m-xylylene diisocyanate, p-xylylene diisocyanate, naphthalene 2,6-diisocyanate, 4,4'-[2,2-bis(4-phenoxyphenyl)propane] diisocyanate, 3,3'- or 2,2'-dimethylbiphenyl 4,4'-diisocyanate, 3,3'- or 2,2'-diethylbiphenyl 4,4'-diisocyanate, 3,3'-dimethoxybiphenyl 4,4'-diisocyanate and 3,3'-diethoxybiphenyl 4,4'-diisocyanate. Examples of the diamine ingredient having an aromatic group used in the present invention are diamines corresponding to the above diisocyanates. Each of them may be used solely or two or more thereof may be used jointly.

Further, a rate of the diisocyanate having an aromatic group in the total diisocyanate is preferred to be 80 mol % or higher, is more preferred to be 90 mol % or higher and may be 100 mol %. Further, a rate of the diamine having an aromatic group in the total diamine is preferred to be 80 mol % or higher, is more preferred to be 90 mol % or higher and may be 100 mol %.

Aliphatic or alicyclic structure may be used as other diisocyanate ingredient or the diamine ingredient within such an extent that the effect of the present invention is not deteriorated thereby. For example, there may be used diisocyanate or diamine in which any of the above-mentioned ingredients is hydrogenated. In addition, there may be also exemplified isophorone diisocyanate, 1,4-cyclohexane diisocyanate, 1,3-cyclohexane diisocyanate, 4,4'-dicyclohexylmethane diisocyanate, ethylene diisocyanate, propylene diisocyanate and hexamethylene diisocyanate as well as diamines corresponding thereto. Each of them may be used solely or two or more thereof may be used jointly. In view of heat resistance of the resulting polyamide-imide resin and of flame retardancy of the adhesive composition using the same, a rate of the above ingredient in the isocyanate ingredient or in the amine ingredient is preferred to be 20 mol % or less.

For a purpose of enhancing the heat resistance of the resulting adhesive composition by increasing reactive points with an epoxy resin, the polyamide-imide resin of the present invention may be copolymerized with a compound having three or more functional groups within such an extent that the effect of the present invention is not deteriorated thereby. Examples thereof include a polyfunctional carboxylic acid such as trimesic acid, a dicarboxylic acid having a hydroxyl group such as 5-hydroxyisophthalic acid, a dicarboxylic acid having an amino group such as 5-aminoisophthalic acid, a compound having three or more hydroxyl groups such as glycerol and polyglycerol and a compound having three or more amino groups such as tris(2-aminoethyl)amine. Among them, the polyfunctional carboxylic acid such as trimesic acid is preferred in view of the heat resistance and a rate thereof in the total acid ingredients is preferred to be 10 mol % or less. When the amount is more than 10 mol %, there maybe a risk that, during a polymerization, gelling happens or insoluble substance is produced.

To the polyamide-imide resin of the present invention, it is possible to copolymerize ingredients for imparting the flexibility and adhesive property such as acrylonitrile-butadiene rubber, aliphatic dicarboxylic acid, dimer acid, polybutadiene, polyester, polyether, polycarbonate, polysiloxane, etc. within such an extent that the effect of the present invention is not deteriorated thereby. When an amount of the copolymerizing ingredient to the polyamide-imide resin at that time is too much, there is a risk that the effect of the present invention such as the adhesive property, heat resistance, flame retardancy and insulation property may be deteriorated. Accordingly, a rate of the above ingredients to the total acid ingredients is preferred to be 10 mol % or less.

The polyamide-imide resin of the present invention can be produced by a known method such as a method wherein the polyamide-imide resin is produced from an acid ingredient and an isocyanate ingredient (isocyanate method), a method wherein an acid ingredient and an amine ingredient are made to react and then the resulting amic acid is subjected to a ring closure (direct method) or a method wherein a compound having acid anhydride and acid chloride is made to react with diamine. In an industrial scale, the isocyanate method is advantageous.

With regard to a method for producing the polyamide-imide resin, the isocyanate method is mentioned hereinafter as a representative one. However, it is also possible to produce the polyamide-imide resin similarly by the above acid chloride method or direct method using the corresponding amine and acid/acid chloride.

The polymerization reaction for the polyamide-imide resin according to the present invention may be carried out in such a manner that the acid ingredient and the isocyanate ingredient are stirred while heating at 60 to 200° C. in a solvent as being publicly known already. At that time, the molar ratio of (the acid ingredient)/(the isocyanate ingredient) is preferred to be within a range of from 85/100 to 100/100. Incidentally, it is general that the amounts of the acid ingredient and the isocyanate ingredient in the polyamide-imide resin are the same as the ratios of the ingredients upon polymerization. In order to promote the reaction, there may be used a catalyst such as an alkali metal compound (such as sodium fluoride, potassium fluoride or sodium methoxide), an amine (such as triethylenediamine, triethylamine, 1,8-diazabicyclo[5.4.0]-7-undecene or 1,5-diazabicyclo-[4.3.0]-5-nonene) and dibutyl tin laurate. When an amount of the catalyst as such is too small, no catalytic effect is achieved while, when it is too much, there is a possibility of causing a side reaction. Accordingly, when the ingredient having more molar numbers between the molar numbers of the acid ingredient and of the isocyanate ingredient is taken as 100 mol %, the catalyst is preferred to be used in 0.01 to 5 mol %, and more preferred to be used in 0.1 to 3 mol %.

As to a solvent which can be used for the polymerization of the polyamide-imide resin of the present invention, there may be exemplified N-methyl-2-pyrrolidone, y-butyrolactone, dimethylimidazolidinone, dimethylsulfoxide, dimethylformamide, dimethylacetamide, cyclohexanone and cyclopentanone. Among them, N-methyl-2-pyrrolidone is preferred due to its solubility and good polymerization efficiency. After the polymerization, dilution with the solvent used for the polymerization or with other low-boiling solvent is carried out whereby concentration of a nonvolatile substance or viscosity of the solution can be adjusted.

As to the low-boiling solvent, there may be exemplified an aromatic solvent such as toluene or xylene, an aliphatic solvent such as hexane, heptane or octane, an alcoholic solvent such as methanol, ethanol, propanol, butanol or isopropanol, a ketonic solvent such as acetone, methyl ethyl ketone, methyl isobutyl ketone, cyclohexanone or cyclopentanone, an etheric solvent such as diethyl ether or tetrahydrofuran and an esteric solvent such as ethyl acetate, butyl acetate or isobutyl acetate.

The polyamide-imide resin of the present invention is mixed with an epoxy resin as a thermosetting ingredient and a phosphorus-type flame retardant as a flame retardant ingredient in a specific rate. As a result thereof, the resulting composition can be used as an adhesive composition suitable for a flexible printed wiring board. Examples of a site in the flexible printed wiring board wherein an adhesive made from the adhesive composition is used are a coverlay film, an adhesive film (an interlayer adhesive material) and a flexible copper-clad laminate as shown in FIG. 1. Particularly, the adhesive composition of the present invention can be suitably used for laminating a copper foil and a polyimide film in a double-sided flexible copper-clad laminate.

A coverlay film is composed of (an insulating plastic film)/(an adhesive layer) or (an insulating plastic film)/(an adhesive layer)/(a protective film). The insulating plastic film is a film in 1 to 200 μm thickness made from plastics such as polyimide, polyamide-imide, polyester, polyphenylene sulfide, polyether sulfone, polyether-ether ketone, aramid, polycarbonate or polyarylate. Two or more films selected therefrom may be layered as well. As to the protective film, there is no particular limitation as far as it can be detached without deteriorating characteristic property of the adhesive. Examples thereof include a plastic film such as polyethylene, polypropylene, polyolefin, polyester, polymethylpentene, polyvinyl chloride, polyvinylidene fluoride and polyphenylene sulfide and a film prepared by subjecting the above film to a coating treatment with silicone, fluoride or other releasing agent as well as paper on which the above film is laminated, paper in which the resin having a releasing property is impregnated or on which the resin having a releasing property is coated, etc.

An adhesive film has such a structure that a protective film is arranged at least on one side of an adhesive layer made from the adhesive composition and has a constitution of (a protective film)/(an adhesive layer) or (a protective film)/(an adhesive)/(a protective film). There may be also such a case wherein an insulating plastic film layer is arranged in the adhesive layer. The adhesive film may be used in a multi-layered printing substrate.

A flexible copper-clad laminate has such a structure that a copper foil is laminated at least on one side of an insulating film (a polyimide film) using an adhesive made from the adhesive composition. Although the copper foil is not particularly limited, a rolled copper foil or an electrolyzed copper foil which has been conventionally used in a flexible printed wiring board may be used therefor. The adhesive composition of the present invention is extremely suitable to be used for laminating a copper foil and a polyimide film in this flexible copper-clad laminate.

In any of the above-mentioned uses, a solution of the adhesive composition is applied onto a film or a copper foil to be used as a substrate and then the solvent is dried so as to carry out a thermal compression treatment and a thermal curing treatment followed by subjecting to an actual use. In some cases, it is also possible to carry out a heating treatment after drying the solvent whereby the polyamide-imide resin, a reactive phosphorus-type flame retardant, and the epoxy resin are partially made to react for a purpose of adjusting a fluidity of the adhesive upon the thermal compression treatment. Incidentally, a state before the thermal compression treatment is called "B stage".

In any of the above-mentioned applications, the heat resistance, adhesive property, and insulation are demanded after the thermal curing. In addition, it is preferred to exhibit the flame retardancy. In the coverlay film and adhesive film, it is general to carry out a process of winding, storing, cutting and punching in a state of B stage. Accordingly, the flexibility in a state of B stage is also necessary. On the other hand, in the flexible copper-clad laminate, it is general to carry out the thermal compression treatment and the thermal curing treatment immediately after the formation of the state of B stage. Accordingly, with regard to the flexibility in the state of B stage, there is no such a strict demand as being demanded for the coverlay film and adhesive film. It is usual that the adhesive layer of the flexible copper-clad laminate is in a thin film of 15 μm or less. Accordingly, with regard to the low-warping in the state of B stage, there is no such a strict demand as being demanded for the coverlay film and adhesive film.

In the adhesive composition of the present invention, although its flexibility and low-warping are somewhat inferior, it satisfies all of the processing ability at low temperature, adhesive property, heat resistance, flame retardancy and electric insulation in high levels. Therefore, it can be suitably used for laminating a copper foil with a polyimide film particularly in a double-sided flexible copper-clad laminate.

The adhesive composition of the present invention is somewhat inferior in the flexibility and low-warping. Accordingly, it cannot be suitably used for a coverlay film and an adhesive film.

In the adhesive composition of the present invention, the mixing rate of the epoxy resin to 85 to 60 parts by mass of the polyamide-imide resin is preferred to be 15 to 40 parts by mass, the mixing rate of the epoxy resin to 85 to 62 parts by mass of the polyamide-imide resin is more preferred to be 15 to 38 parts by mass, and the mixing rate of the epoxy resin to 85 to 65 parts by mass of the polyamide-imide resin is further preferred to be 15 to 35 parts by mass. When the mixing rate of the epoxy resin is too small, it is not possible to form a sufficient cross-linking structure by a reaction with the polyamide-imide resin and thus it is not possible to satisfy the heat resistance and insulation after curing of the adhesive. In addition, the polyamide-imide resin cannot obtain any sufficient plastic effect, and thus it is not possible to satisfy the processing ability at low temperature. When the mixing rate of the epoxy resin is too much, the rate of the polyamide-imide resin having excellent heat resistance lowers and thus the unreacted epoxy resin remains whereby the heat resistance after curing of the adhesive lowers.

As to the epoxy resin used in the adhesive composition of the present invention, an epoxy resin which is liquid at 25° C. is used in view of the processing ability at low temperature. The epoxy resin which is liquid at 25° C. may be modified and may also contain sulfur atom, nitrogen atom, phosphorus atom, etc. in its molecular skeleton. Examples thereof include epoxy resin of a bisphenol A type, epoxy resin of a bisphenol F type, epoxy resin of a bisphenol S type or a hydrogenated product thereof; epoxy resin of a phenol novolak type, epoxy resin of a cresol novolak type, epoxy resin having a naphthalene skeleton, epoxy resin having a dicyclopentadiene skeleton, epoxy-modified acrylonitrile butadiene rubber, epoxy-modified polybutadiene, aliphatic epoxy resin and alicyclic epoxy resin. As to a commercially available product thereof, there are exemplified bisphenol A-type liquid epoxy resin such as jER 825, jER 827, jER 828, and YL 980 manufactured by Mitsubishi Chemical, Epiclon 840, 840-S, 850, 850-S, EXA-850CRP, and 850-LC manufactured by DIC, and YD-115, YD-127, YD-128, YD-8125, YD-825GS, and YD-825GHS manufactured by Nippon Steel & Sumikin Chemical; bisphenol F-type liquid epoxy resin such as jER 806, jER 806H, jER 807, and YL 983U manufactured by Mitsubishi Chemical, Epiclon 830, 830-S, 835, EXA-830CRP, EXA-83OLVP, and EXA-835LV manufactured by DIC, and YDF-170, YDF-8170C, and YDF-870GS manufactured by Nippon Steel & Sumikin Chemical; hydrogenated bisphenol A-type epoxy resin such as YX 8000 and YX 8034 manufactured by Mitsubishi Chemical and ST-3000 manufactured by Nippon Steel & Sumikin Chemical; phenol novolak-type liquid epoxy such as jER 152 manufactured by Mitsubishi Chemical and Epiclon N-730A manufactured by DIC; alicyclic epoxy resin such as Celoxide 2021P and 2081 manufactured by Daicel Chemical; naphthalene-type liquid epoxy such as Epiclon HP-4032 D manufactured by DIC; NBR-modified epoxy such as Epiclon TSR-960 and TSR-601 manufactured by DIC; dimeric acid-modified epoxy such as jER 871 and jER 872 manufactured by Mitsubishi Chemical and Epotot YD-172 manufactured by Nippon Steel & Sumikin Chemical; butadiene-modified epoxy such as JR-100 and JP-200 manufactured by Nippon Soda; triglycidyl isocyanurate such as TEPIC manufactured by Nissan Chemical; and Denacol EX-1000 series, Denacol L series, Denacol DLC series, Denalex series, EX 991, etc. manufactured by Nagase Chemtex. Each of them may be used solely or a plurality of them may be used jointly.

In addition to the above-mentioned epoxy resins being liquid at 25° C., it is possible to use an epoxy resin being semi-solid or solid at 25° C. in an amount of 30% by mass or less together therewith within such an extent that the effect of the present invention is not deteriorated thereby. It is however necessary that a property of the used epoxy resins is liquid at 25° C. as a whole. The epoxy resin which is semi-solid or solid at 25° C. may be modified and may also contain sulfur atom, nitrogen atom, phosphorus atom, etc. in its molecular skeleton. Examples thereof include epoxy resin of a bisphenol A type, epoxy resin of a bisphenol F type, epoxy resin of a bisphenol S type or a hydrogenated product thereof; epoxy resin of a phenol novolak type, epoxy resin of a cresol novolak type, epoxy resin having a naphthalene skeleton, epoxy resin having a dicyclopentadiene skeleton, aliphatic epoxy resin and alicyclic epoxy resin. As to a commercially available product thereof, there are exemplified bisphenol A-type epoxy resin such as jER 1001, jER 1004, jER 1007, and jER 1010 manufactured by Mitsubishi Chemical, Epotot YD-134, YD-011, YD-014, and YD-017 manufactured by Nippon Steel & Sumikin Chemical, and Epiclon 860, 1050, 1055, 2050, 3050, 4050, and 7050 manufactured by DIC; bisphenol F-type epoxy resin such as jER 4004P, jER 4005P, jER 4007P, and jER 4010P manufactured by Mitsubishi Chemical, and Epotot YDF-2001 and YDF-2004 manufactured by Nippon Steel & Sumikin Chemical; hydrogenated bisphenol A-type epoxy resin such as ST-400D manufactured by Nippon Steel & Sumikin Chemical; phenol novolak-type epoxy resin such as jER 154 manufactured by Mitsubishi Chemical and Epiclon N-740, N-770, and N-775 manufactured by DIC, and DEN-438 manufactured by The Dow Chemical Company; cresol novolak type epoxy resin such as Epiclon N-660, N-665, N-670, N-673, N-680, N-690, and N-695 manufactured by DIC, and Epotot YDCN-700-7 and YDCN-700-10 manufactured by Nippon Steel & Sumikin Chemical; naphthalene-type epoxy resin such as Epiclon HP-4700, HP-4710, HP-4770, HP-5000, and HP-6000 manufactured by DIC; dicyclopentadiene-type epoxy resin such as Epiclon HP-7200L, HP-7200, HP-7200H, HP-7200HH, and HP-7200HHH manufactured by DIC; alicyclic epoxy resin such as EHPE 3150 manufactured by Daicel Chemical; biphenyl-type epoxy resin such as YX4000 and YX4000H manufactured by Mitsubishi Chemical; phosphorus-containing epoxy resin such as EXA-9726 manufactured by DIC. Each of them may be used solely or a plurality of them may be used jointly.

In the adhesive composition of the present invention, it is preferred that 15 to 60 parts by mass of a phosphorus-type flame retardant is compounded with 100 parts by mass in total of the polyamide-imide resin and the epoxy resin. It is more preferred that 15 to 55 parts by mass of a phosphorus-type flame retardant is compounded with 100 parts by mass in total of the polyamide-imide resin and the epoxy resin, and further preferred that 15 to 50 parts by mass of a phosphorus-type flame retardant is compounded with 100 parts by mass in total of the polyamide-imide resin and the epoxy resin. When the compounding amount of the phosphorus-type flame retardant is too small, good flame retardancy may not be achieved and, moreover, sufficient plasticizing affect is not achieved in the polyamide-imide resin whereby the processing ability at low temperature may not be satisfactory. On the contrary, when the compounding amount of the phosphorus-type flame retardant is too much, the adhesive property, heat resistance and insulating property may lower.

There is no particular limitation for the phosphorus-type flame retardant used in the present invention so far as it contains phosphorus atom in its structure. However, in view of a hydrolysis resistance, a heat resistance and a bleeding out and further in view of a compatibility with and a plasticizing effect for the polyamide-imide resin, a phosphinic acid derivative of a phenanthrene type is used in 50% by mass or more. The phosphinic acid derivative maybe used solely or a plurality thereof may be used jointly.

Examples of the phosphinic acid derivative of a phenanthrene type include 9,10-dihydro-9-oxa-10-phosphaphenanthrene-10-oxide (trade name: HCA manufactured by Sanko), 10-benzyl-10-hydro-9-oxa-10-phosphaphenanthrene-10-oxide (trade name: BCA manufactured by Sanko) and 10-(2,5-dihydroxyphenyl)-10-H-9-oxa-10-phosphaphenanthrene-10-oxide (trade name: HCA-HQ manufactured by Sanko). When the phosphinic acid derivative as such is represented by a structural formula, it is a non-reactive phosphorus-type flame retardant having the following structure [I] in its structure.

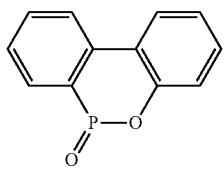

Preferred examples of the phosphinic acid derivative having the structure [I] in its structure are as follows.

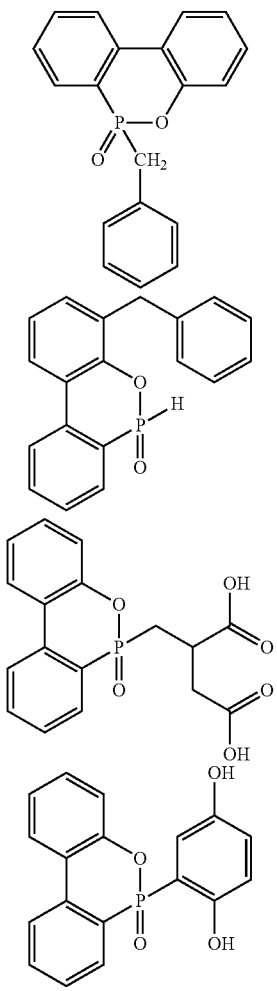

Besides the above-mentioned phosphinic acid derivative, it is also possible, upon necessity, to use other phosphorus compound either solely or jointly by combining a plurality thereof in an amount of less than 50% by mass within such a range that such a use does not deteriorate the flame retardancy, heat resistance in soldering and bleeding out.

Generally, the epoxy resin contains chlorine as an impurity during the course of its production. However, there has been a demand to lower an amount of halogen in view of reduction of environmental load. It has been also known that, when chlorine or, particularly, hydrolyzable chlorine is abundant, the insulating property lowers. Accordingly, a total amount of chlorine in a nonvolatile ingredient of the adhesive composition is preferred to be 500 ppm or less.

To the adhesive composition of the present invention, it is also possible to add an organic solvent which exhibits a surface tension of 33 dyn/cm or less in addition to the above-mentioned organic solvent, so as to enhance a stability in application within such a range that the effect of the present invention is not deteriorated thereby. Examples thereof are an aromatic solvent such as toluene and xylene; an aliphatic solvent such as hexane, heptane and octane; an alcoholic solvent such as methanol, ethanol, propanol, butanol and isopropanol; a ketone-type solvent such as acetone, methyl ethyl ketone, methyl isobutyl ketone, cyclohexanone and cyclopentanone; an ether-type solvent such as diethyl ether and tetrahydrofuran; an ester-type solvent such as ethyl acetate, butyl acetate and isobutyl acetate; and an acetate-type solvent such as diethylene glycol monoethyl ether acetate and diethylene glycol monobutyl ether acetate. Each of them may be used solely or a plurality thereof may be used jointly.

To the adhesive composition of the present invention, it is also possible to add a surface adjusting agent, so as to enhance a stability in application within such a range that the effect of the present invention is not deteriorated thereby. In view of the adhesive property, the surface adjusting agent is preferred to be such a one which exhibits a boiling point of 150° C. or lower, more preferred such a one which exhibits a boiling point of 120° C. or lower. Although there is no particular limitation therefor, specific examples thereof are Surfinol 104E, 104H, 104A, 104PA, 104S, 420, 440, 465, 485, SE, and SE-F and Olfin EXP. 4001, EXP. 4123, EXP. 4200, and EXP. 4300 etc. manufactured by Nisshin Kagaku Kogyo. Each of them may be used solely or a plurality thereof may be used jointly. A compounding amount thereof to 100 parts by mass of the polyamide-imide resin is from 0.01 to 0.5 part by mass and preferably from 0.05 to 0.3 part by mass. When the compounding amount of the surface adjusting agent is too small, the stability in application may be hardly achieved. When the compounding amount is too much, the adhesive property may be hardly expressed.

In the copper foil equipped with an adhesive layer according to the present invention, an amount of residual solvent in the adhesive layer in a state of B stage is preferably 5.0 to 16.0% by mass, more preferably 5.0 to 13.0% by mass and further preferably 8.0 to 13.0% by mass. When the amount of the residual solvent is too small, the processing ability at low temperature may lower. When the amount of the residual solvent is too mush, the electric insulation may lower.

The residual amount of the solvent in the adhesive layer is measured by the following method. Thus, a solution of the adhesive composition is applied onto a non-glossy side of a copper foil (BHY manufactured by JX Nikko Nisseki; 18 μm in thickness) so that a thickness after drying became 5 μm and then dried using a hot-air drier at 110° C. for 3 minutes to give a sample in a state of B stage. A surface of the sample in a state of B stage applied with the adhesive is subjected to thermal compressive adhesion to a polyimide film (Capton 100 EN manufactured by Toray DuPont) using a vacuum press laminating machine in vacuo at 130° C. and 3 MPa for 30 seconds. After that, the polyimide film is released to give a copper foil equipped with an adhesive layer. Temperature of this copper foil equipped with an adhesive layer is raised up from a room temperature to 300° C. at a rate of 20°

C./min using a colorimeter measuring device (TGA Q500 manufactured by TA Instrument) in a nitrogen atmosphere to measure the residual solvent amount in the adhesive layer of the copper foil equipped with the adhesive layer.

The residual solvent amount in the adhesive layer is calculated from a mass reducing rate (excluding a mass of the copper foil) at 250° C. compared with 100° C. as mentioned below.

Residual solvent amount in the adhesive layer (%)=
[(mass of the copper foil equipped with the adhesive layer at 250° C.)−(mass of the copper foil)]/[(mass of the copper foil equipped with the adhesive layer at 100° C.)−(mass of the copper foil)]×100

To the adhesive composition of the present invention, glycidylamine may be added thereto in addition the above epoxy resin for a purpose of promoting a curing within such an extent that the effect of the present invention is not deteriorated thereby. An amount of the glycidylamine to be added is preferred to be 0.01 to 5% by mass, and more preferred to be 0.05 to 2% by mass, to the total weight of polyamide-imide resin and epoxy resin in the adhesive composition. When the adding amount of the glycidylamine is too small, the curing promotion effect may not be achieved. When the adding amount is too much, the curing promotion effect on an epoxy group may be too big whereby a reaction between a reactive functional group in the polyamide-imide resin and the epoxy group may not sufficiently progress. As a result, the heat resistance and adhesive property may lower. Examples of the glycidylamine include TETRAD-X and TETRAD-C (trade names) manufactured by Mitsubishi Gas Chemical, GAN (trade name) manufacture by Nippon Kayaku and ELM-120 (trade name) manufactured by Sumitomo Chemical. Each of them may be used solely or two or more thereof may be used jointly.

To the adhesive composition of the present invention, a curing agent or a curing promoter for the epoxy resin may be added within such an extent that the effect of the present invention is not deteriorated thereby. As to the curing agent, although there is no particular limitation as far as it is a compound being reactive with the epoxy resin, examples thereof include a curing agent of an amine type, a compound having a phenolic hydroxyl group, a compound having carboxylic acid and a compound having acid anhydride. As to the curing promoter, although there is no particular limitation as far as it promotes the reaction of the epoxy resin with the polyamide-imide resin and the above curing agent, examples thereof include imidazole derivatives such as 2MZ, 2E4MZ, $C_{11}Z$, $C_{17}Z$, 2PZ, 1B2MZ, 2MZ-CN, 2E4MZ-CN, $C_{11}$Z-CN, 2PZ-CN, 2PHZ-CN, 2MZ-CNS, 2E4MZ-CNS, 2PZ-CNS, 2MZ-AZINE, 2E4MZ-AZINE, $C_{11}$Z-AZINE, 2MA-OK, 2P4MHZ, 2PHZ and 2P4BHZ manufactured by Shikoku Kasei Kogyo; guanamines such as acetoguanamine and benzoguanamine; polyamines such as diaminodiphenylmethane, m-phenylenediamine, m-xylene-diamine, diaminodiphenylsulfone, dicyandiamide, urea, urea derivatives, melamine and polybasic hydrazide; an organic acid salts and/or an epoxy adducts thereof; an amine complex of boron trifluoride; triazine derivatives such as ethyldiamino-S-triazine, 2,4-diamino-S-triazine and 2,4-diamino-6-xylyl-S-triazine; tertiary amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine, DBU (1,8-diazabicyclo[5.4.0]-7-undecene) and DBN (1,5-diazabicyclo[4.3.0]-5-nonene); organic acid salts and/or tetraphenylboroates thereof; polyvinylphenol, polyvinylphenol bromide; organic phosphines such as tributylphosphine, triphenylphosphine and tris-2-cyanoethylphosphine; quaternary phosphonium salts such as tri-n-butyl(2,5-dihydroxyphenyl)phosphonium bromide, hexadecyltributylphosphonium chloride and tetraphenylphosphonium tetraphenylboroate; quaternary ammonium salts such as benzyltrimethylammonium chloride and phenyltributyl-ammonium chloride; the above polycarboxylic acid anhydride; catalysts for optical cationic polymerization such as diphenyliodonium tetrafluoroborate, triphenylsulfonium hexafluoroantimonate, 2,4,6-triphenylthiopyrylium hexa-fluorophospohate, Irgacure 261 (manufactured by Ciba Specialty Chemicals) and Optomer SP-170 (manufactured by Adeka); a styrene-maleic acid anhydride resin; an equimolar reaction product of phenyl isocyanate with dimethylamine; and equimolar reaction products of organic polyisocyanate (such as tolylene diisocyanate or isophorone diisocyanate) with dimethylamine. Each of those curing agents and curing promoters may be used solely or two or more thereof may be used jointly.

A silane coupling agent may be added to the adhesive composition of the present invention for a purpose of enhancing the adhesive property within such an extent that the effect of the present invention is not deteriorated thereby. There is no particular limitation therefor as far as it is a conventionally known silane coupling agent. Specific examples thereof include aminosilanes, mercaptosilane, vinylsilane, epoxysilane, methacrylsilane, isocyanatesilane, ketiminesilane, a mixture or a reaction product thereof and compounds prepared from the above with polyisocyanate. Examples of the silane coupling agent as such include aminosilanes such as 3-aminopropyltrimethoxysilane, 3-aminopropyltriethoxysilane, 3-aminopropylmethyldimethoxysilane, 3-aminopropylethyldiethoxysilane, bistrimethoxysilylpropylamine, bistriethoxysilylpropylamine, bismethoxydimethoxysilylpropylamine, bisethoxydiethoxysilylpropylamine, N-2-(aminoethyl)-3-aminopropyltrimethoxysilane, N-2-(aminoethyl)-3-aminopropylmethyldimethoxysilane, N-2-(amino-ethyl)-3-aminopropyltriethoxysilane and N-2-(aminoethyl)-3-aminopropylethyldiethoxysilane; mercaptosilanes such as γ-mercaptopropyltrimethoxysilane, γ-mercaptopropyltriethoxysilane, γ-mercaptopropylmethyldimethoxysilane, γ-mercaptopropylmethyldiethoxysilane and γ-mercaptopropylethyldiethoxysilane; vinylsilanes such as vinyltrimethoxysilane, vinyltriethoxysilane and tris-(2-methoxyethoxy)vinylsilane; epoxysilanes such as γ-glycidoxypropyltrimethoxysilane, γ-glycidoxypropyldimethylethoxysilane, γ-glycidoxypropylmethyldiethoxysilane, β-(3,4-epoxycyclohexyl)ethylmethyldimethoxysilane, γ-glycidoxypropyltrimethoxysilane and β-(3,4-epoxycyclohexyl)ethyltrimethoxysilane; methacrylsilanes such as 3-methacryloxypropylmethyldimethoxysilane, 3-methacryloxypropyltrimethoxysilane, 3-methacryloxypropylmethyldiethoxysilane and 3-methacryl-oxypropyltriethoxysilane; isocyanate silane such as propyltriethoxysilane isocyanate and propoyltrimethoxysilane isocyanate; and ketiminesilanes such as ketiminized propyltrimethoxysilane and ketiminized propyltriethoxysilane. Each of them may be used solely or two or more thereof may be used jointly. Epoxysilanes among those silane coupling agents have a reactive epoxy group. Accordingly, they can react with a polyamide-imide resin whereby they are preferred in view of enhancement of the heat resistance and moist heat resistance. A compounding amount of the silane coupling agent when the total amount of nonvolatile ingredient in the adhesive composition is taken as 100% by mass is preferably 0 to 3% by mass and, more preferably, 0 to 2% by mass. When the compounding amount is too much, the heat resistance may lower.

To the adhesive composition of the present invention, organic/inorganic filler may be added for a purpose of enhancement of the resistance to solder heat within such an extent that the effect of the present invention is not deteriorated thereby. As to the organic filler, there may be exemplified powder of polyimide or polyamide-imide which is a heat resisting resin. As to the inorganic filler, there may be exemplified silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO·TiO_2$), barium carbonate ($BaCO_3$), lead titanate ($PbO·TiO_2$), lead titanate zirconate (PZT), lanthanum lead titanate zirconate (PLZT), gallium oxide ($Ga_2O_3$), spinel ($MgO·Al_2O_3$), mullite ($3Al_2O_3·2SiO_2$), cordierite ($2MgO·2Al_2O_3·5SiO_2$), talc ($3MgO·4SiO_2·H_2O$), aluminum titanate ($TiO_2—Al_2O_3$), yttria-containing zirconia ($Y_2O_3—ZrO_2$), barium silicate ($BaO·8SiO_2$), boron nitride (BN), calcium carbonate ($CaCO_3$), calcium sulfate ($CaSO_4$), zinc oxide (ZnO), magnesiumtitanate ($MgO·TiO_2$), barium sulfate ($BaSO_4$), organic bentonite, clay, mica, aluminum hydroxide and magnesium hydroxide. Among them, silica is preferred in view of its easy dispersing property and of the effect for enhancing the heat resistance. Each of them may be used solely or two or more thereof may be used jointly. An adding amount of the organic/inorganic filler as such to the non-volatile ingredient of the adhesive composition is preferred to be 1 to 30% by mass, and more preferred to be 3 to 15% by mass. When adding amount of the organic/inorganic filler is too much, a coat of the adhesive may become brittle while, when it is too small, the effect for enhancing the heat resistance may not be sufficiently achieved.

The adhesive composition containing the polyamide-imide resin and the epoxy resin in accordance with the present invention is excellent in the processing ability at low temperature and adhesive property and can strongly adhere a polyimide film with a copper foil at a temperature of 150° C. or lower. The resulting flexible copper-clad laminate is excellent in the heat resistance, flame retardancy, electric insulation and dimensional stability. The reason therefor is that the processing ability at low temperature and adhesive property are imparted by the epoxy resin being liquid at ambient temperature and that the heat resistance, flame retardancy, electric insulation and dimensional stability are imparted by the polyamide-imide resin being rigid and having a high glass transition temperature. Further, the fact that a strong cross-linking product is formed by heat curing since the compounding ratio of polyamide-imide resin to the epoxy resin is within a specific range also contributes to the above-mentioned characteristics.

EXAMPLES

As hereunder, effects of the present invention will be demonstrated by way of Examples although the present invention is not limited to those Examples only. Evaluations of the characteristics in Examples were carried out according to the following methods.

Logarithmic Viscosity

The polyamide-imide resin made into a solid was dissolved in N-methyl-2-pyrrolidone so that the polymer concentration was made 0.5 g/dl. Solution viscosity and solvent viscosity of the resulting solution were measured by the Ubbelohde's viscosity tube at 30° C. The logarithmic viscosity was calculated according to the following formula.

Logarithmic viscosity (dl/g)=[ln ($V1/V2$)]/$V3$

In the above formula, V1 is the solution viscosity measured by the Ubbelohde's viscosity tube and V2 is the solvent viscosity measured by the Ubbelohde's viscosity tube. V1 and V2 were determined from a time needed for passing the polymer solution and the solvent (N-methyl-2-pyrrolidone) through a capillary of the viscosity tube. V3 is a polymer concentration (g/dl).

Acid Value

A polyamide-imide resin (0.1 g) made into a solid was dissolved in 20 ml of N-methyl-2-pyrrolidone and titrated with KOH using Thymolphthalein as an indicator to measure a carboxyl group equivalent per $10^6$ g of the resin. The resulting value was used as the acid value.

Glass Transition Temperature

The polyamide-imide resin solution was applied onto a glossy surface of a copper foil, dried with a hot-air drier at 140° C. for 3 minutes and dried at 250° C. for 30 minutes under a nitrogen atmosphere to give a copper foil equipped with the resin. After that, the copper foil was etched to prepare a polyamide-imide resin film of 20 μm thickness. Glass transition temperature of the polyamide-imide resin film prepared as such was measured by a TMA (thermal mechanical analyzer) needle penetration method under a condition wherein a load was 5 g and a temperature rising rate was 10° C./minutes.

Processing Ability at Low Temperature

A solution of the adhesive composition is applied onto a non-glossy side of a copper foil (BHY manufactured by JX Nikko Nisseki; 18 μm in thickness) so that a thickness after drying became 5 μm and then dried using a hot-air drier at 110° C. for 3 minutes to give a sample in a state of B stage. A surface of the sample in a state of B stage applied with the adhesive is subjected to thermal compressive adhesion to a polyimide film (Capton 100 EN manufactured by Toray DuPont) using a vacuum press laminating machine in vacuo at 130° C. and 3 MPa for 30 seconds. In the sample after the thermal compressive adhesion, when the sample did not exhibit any poor lamination such as lifting and detachment, it was evaluated as "o" while when the sample exhibited a poor lamination such as lifting and detachment, it was evaluated as "x".

Adhesive Property

A solution of the adhesive composition is applied onto a non-glossy side of a copper foil (BHY manufactured by JX Nikko Nisseki; 18 μm in thickness) so that a thickness after drying became 5 μm and then dried using a hot-air drier at 110° C. for 3 minutes to give a sample in a state of B stage. A surface of the sample in a state of B stage applied with the adhesive is subjected to thermal compressive adhesion to a polyimide film (Capton 100 EN manufactured by Toray DuPont) using a vacuum press laminating machine in vacuo at 130° C. and 3 MPa for 30 seconds. After that, a thermal curing treatment was carried out at 200° C. for 3 hours. From the sample after the curing, the copper foil was peeled off using a tensile tester (Autograph AG-X plus manufactured by Shimadzu) under an environment of 25° C. in a direction of 180° at a rate of 50 mm/minute whereupon an adhesive strength was measured. When the sample exhibited the adhesive strength of 0.7 N/mm or more, it was evaluated as "o". When the sample exhibited the adhesive strength of less than 0.7 N/mm, it was evaluated as "x".

Heat Resistance to Solder

A sample was prepared in the same manner as in the case for the evaluation of the adhesive property. Then, it was cut into 20-mm squares and floated on a solder bath of 300° C. in such a state that the polyimide surface was made upside.

When the sample did not exhibit any swelling and detachment, it was evaluated as "o". When the sample exhibited either swelling or detachment, it was evaluated as "x".

Flame Retardancy

A solution of the adhesive composition is applied onto a polyimide film (APICAL 12.5 NPI manufactured by KANEKA CORPORATION) so that a thickness after drying became 20 µm and then dried using a hot-air drier at 140° C. for 3 minutes to give a sample in a state of B stage. A surface of the sample in a state of B stage applied with the adhesive is subjected to thermal compressive adhesion to a polyimide film (APICAL 12.5 NPI manufactured by KANEKA CORPORATION) using a vacuum press laminating machine in vacuo at 130° C. and 3 MPa for 30 seconds. After that, a thermal curing treatment was carried out at 200° C. for 3 hours. The sample after the curing was subjected to an evaluation for flame retardancy in accordance with UL-94VTM standard. When the sample satisfied VTM-0, it was evaluated as "o". When the sample did not satisfy VTM-0, it was evaluated as "x".

HAST Test

A solution of the adhesive composition is applied onto a polyimide film (APICAL 12.5 NPI manufactured by KANEKA CORPORATION) so that a thickness after drying became 20 µm and then dried using a hot-air drier at 140° C. for 3 minutes to give a sample in a state of B stage. A surface of the sample in a state of B stage applied with the adhesive and a comb-shaped pattern wherein L/S was 50/50 µm were subjected to thermal compressive adhesion using a vacuum press laminating machine in vacuo at 160° C. and 3 MPa for 30 seconds. After that, a thermal curing treatment was carried out at 200° C. for 3 hours. Under such an environment wherein a temperature was 121° C. and a humidity was 100%, voltage of 100 V was applied for 250 hours. The product wherein the resistance after 250 hours was $1 \times 10^9$ Ω or higher and no dendrite was noted was evaluated as "oo", that wherein the resistance after 250 hours was from $1 \times 10^8$ Ω to less than $1 \times 10^9$ Ω and no dendrite was noted was evaluated as "o" and that wherein the resistance after 250 hours was less than $1 \times 10^8$ Ω or dendrite was generated was evaluated as "x".

Polymerization of Polyamide-Imide Resins 1 to 8

Polymerization of the polyamide-imide resin was carried out using the starting material resins in a composition rate (mol %) as shown in Table 1. To be more specific, polymerization was carried out as follows.

Polymerization of Polyamide-Imide Resins 1 to 4

Trimellitic anhydride (192.13 g, 1.00 mol), 217.73 g (0.87 mol) of 4,4'-diphenylmethane diisocyanate and 482.78 g of N-methyl-2-pyrrolidone were added to a four-necked separable flask equipped with a stirrer, a cooling pipe, a nitrogen-introducing pipe and a thermometer so as to make the concentration of the resin after decarbonization 40% by weight. Then, the mixture was made to react for 2 hours by raising a temperature up to 100° C. under a nitrogen atmosphere, and further heated up to 150° C. and the reaction was carried out for 5 hours. After that, 114.95 g of N-methyl-2-pyrrolidone was added thereto for dilution so as to make the concentration of the resin 35% by weight whereupon a solution of the polyamide-imide resin 1 was prepared. With regard to other polyamide-imide resins 2 to 4, polymerization of the resin was carried out using the starting material resins in the composition rate as shown in Table 1 to give the solutions.

Polymerization of Polyamide-Imide Resin 5

Trimellitic anhydride (192.13 g, 1.00 mol), 237.75 g (0.95 mol) of 4,4'-diphenylmethane diisocyanate and 634.91 g of N-methyl-2-pyrrolidone were added to a four-necked separable flask equipped with a stirrer, a cooling pipe, a nitrogen-introducing pipe and a thermometer so as to make the concentration of the resin after decarbonization 35% by weight. Then, the mixture was made to react for 2 hours by raising a temperature up to 100° C. under a nitrogen atmosphere, and further heated up to 150° C. and the reaction was carried out for 5 hours. After that, 162.89 g of N-methyl-2-pyrrolidone was added thereto for dilution so as to make the concentration of the resin 30% by weight whereupon a solution of the polyamide-imide resin 5 was prepared.

Polymerization of Polyamide-Imide Resin 6

Trimellitic anhydride (192.13 g, 1.00 mol), 211.42 g (0.80 mol) of o-tolidine diisocyanate, 34.83 g (0.20 mol) of tolylene diisocyanate, and 650.72 g of N-methyl-2-pyrrolidone were added to a four-necked separable flask equipped with a stirrer, a cooling pipe, a nitrogen-introducing pipe and a thermometer so as to make the concentration of the resin after decarbonization 35% by weight. Then, the mixture was made to react for 2 hours by raising a temperature up to 100° C. under a nitrogen atmosphere, and further heated up to 150° C. and the reaction was carried out for 5 hours. After that, 750.83 g of N-methyl-2-pyrrolidone was added thereto for dilution so as to make the concentration of the resin 20% by weight whereupon a solution of the polyamide-imide resin 6 was prepared.

Polymerization of Polyamide-Imide Resins 7 and 8

Trimellitic anhydride (180.60 g, 0.94 mol), 225.23 g (0.90 mol) of 4,4'-diphenylmethane diisocyanate, 210.00g (0.06 mol) of acrylonitrile butadiene rubber wherein carboxyl groups at both terminals have been modified (molecular weight: 3500), and 804.95 g of N,N-dimethylacetamide were added to a four-necked separable flask equipped with a stirrer, a cooling pipe, a nitrogen-introducing pipe and a thermometer so as to make the concentration of the resin after decarbonization 40% by weight. Then, the mixture was made to react for 2 hours by raising a temperature up to 100° C. under a nitrogen atmosphere, and further heated up to 150° C. and the reaction was carried out for 5 hours. After that,447.20 g of N,N-dimethylacetamid was added thereto for dilution so as to make the concentration of the resin 30% by weight whereupon a solution of the polyamide-imide resin 7 was prepared. With regard to other polyamide-imide resin 8, polymerization of the resin was carried out using the starting material resins in the composition rate as shown in Table 1 to give the solution.

TABLE 1

|  | Starting material | polyamide-imide resin 1 | polyamide-imide resin 2 | polyamide-imide resin 3 | polyamide-imide resin 4 | polyamide-imide resin 5 | polyamide-imide resin 6 | polyamide-imide resin 7 | polyamide-imide resin 8 |
|---|---|---|---|---|---|---|---|---|---|
| Resin composition (mol %) | TMA | 100 | 100 | 80 | 80 | 100 | 100 | 94 | 94 |
|  | BTDA |  |  | 20 |  |  |  |  |  |
|  | TMEG |  |  |  | 20 |  |  |  |  |
|  | NBR |  |  |  |  |  |  | 6 | 6 |
|  | MDI | 87 | 90 |  | 90 | 95 |  | 90 | 102 |
|  | TDI |  |  | 90 |  |  | 20 |  |  |
|  | ToDI |  |  |  |  |  | 80 |  |  |
| Resin property | acid value (mgKOH/g) | 106 | 93 | 99 | 82 | 67 | 5 |  | 21 |
|  | glass transition temperature (° C.) | 280 | 280 | 290 | 260 | 280 | 320 | 180 | 180 |

TMA: trimellitic anhydride
BTDA: benzophenone-tetracarboxylic acid dianhydride
TMEG: ethylene glycol bisanhydrotrimellitate
NBR: acrylonitrile butadiene rubber wherein carboxyl groups at both terminals have been modified
MDI: 4,4'-diphenylmethane diisocyanate
TDI: tolylene diisocyanate
ToDI: o-tolidine diisocyanate Preparation of Solutions of Adhesive Compositions Solutions of the adhesive compositions of Examples 1 to and Comparative Examples 1 to 9 dissolved in N-methyl-2-pyrrolidone or N,N-dimethylacetamide were prepared according to the adhesive compounding rate (in % by mass of solid) as shown in Table 2 and the above properties were evaluated.

TABLE 2

|  | Starting material | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|---|
| Adhesive composition (in terms of solid mass) | polyamide-imide resin 1 | 60 |  |  |  |  |  |  |  |  |
|  | polyamide-imide resin 2 |  | 60 |  |  |  |  |  |  | 40 |
|  | polyamide-imide resin 3 |  |  | 60 |  |  |  |  |  |  |
|  | polyamide-imide resin 4 |  |  |  | 60 |  |  |  |  |  |
|  | polyamide-imide resin 5 |  |  |  |  | 60 |  |  |  |  |
|  | polyamide-imide resin 6 |  |  |  |  |  | 60 |  |  |  |
|  | polyamide-imide resin 7 |  |  |  |  |  |  | 60 |  |  |
|  | polyamide-imide resin 8 |  |  |  |  |  |  |  | 60 |  |
| epoxy resin | YDF8170C | 19 | 19 | 19 | 19 | 19 | 19 | 19 | 19 | 39 |
|  | jER152 |  |  |  |  |  |  |  |  |  |
|  | YDCN700-10 |  |  |  |  |  |  |  |  |  |
| phosphorus-type flame retardant | BCA | 21 | 21 | 21 | 21 | 21 | 21 | 21 | 21 | 21 |
|  | SPH-100 |  |  |  |  |  |  |  |  |  |
|  | phosphorus content | 2.1 | 2.1 | 2.1 | 2.1 | 2.1 | 2.1 | 2.1 | 2.1 | 2.1 |
|  | processing ability at low temperature | ○ | ○ | ○ | ○ | ○ | ○ | ○ | ○ | ○ |
|  | adhesive property | ○ | ○ | ○ | ○ | ○ | x | ○ | x | x |
|  | heat resistance to solder | ○ | ○ | ○ | ○ | ○ | x | ○ | x | x |
|  | flame retardancy | ○ | ○ | ○ | ○ | ○ | ○ | ○ | ○ | ○ |
|  | HAST | ○ | ○ | ○ | ○ | ○ | x | x | x | x |

|  | Starting material | Example 6 | Example 7 | Comparative Example 5 | Comparative Example 6 | Example 8 | Example 9 | Comparative Example 7 | Example 10 |
|---|---|---|---|---|---|---|---|---|---|
| Adhesive composition) (in terms of solid mass | polyamide-imide resin 1 |  |  |  |  |  |  |  |  |
|  | polyamide-imide resin 2 | 50 | 65 | 70 | 40 | 50 | 65 | 70 | 60 |
|  | polyamide-imide resin 3 |  |  |  |  |  |  |  |  |
|  | polyamide-imide resin 4 |  |  |  |  |  |  |  |  |
|  | polyamide-imide resin 5 |  |  |  |  |  |  |  |  |
|  | polyamide-imide resin 6 |  |  |  |  |  |  |  |  |
|  | polyamide-imide resin 7 |  |  |  |  |  |  |  |  |
|  | polyamide-imide resin 8 |  |  |  |  |  |  |  |  |
| epoxy resin | YDF8170C | 24 | 14 | 9 | 19 | 19 | 19 | 19 |  |
|  | jER152 |  |  |  |  |  |  |  | 19 |
|  | YDCN700-10 |  |  |  |  |  |  |  |  |
| phosphorus-type flame retardant | BCA | 21 | 21 | 21 | 41 | 31 | 16 | 11 | 21 |
|  | SPH-100 |  |  |  |  |  |  |  |  |

TABLE 2-continued

| | | | | | | | | |
|---|---|---|---|---|---|---|---|---|
| phosphorus content | 2.2 | 2.1 | 2.1 | 4.1 | 3.1 | 1.6 | 1.1 | 2.1 |
| processing ability at low temperature | ○ | ○ | x | ○ | ○ | ○ | x | ○ |
| adhesive property | ○ | ○ | x | ○ | ○ | ○ | ○ | ○ |
| heat resistance to solder | ○ | ○ | x | ○ | ○ | ○ | ○ | ○ |
| flame retardancy | ○ | ○ | ○ | ○ | ○ | ○ | ○ | ○ |
| HAST | ○ | ○ | x | x | ○ | ○ | ○ | ○ |

| | | Starting material | Comparative Example 8 | Example 11 | Comparative Example 9 |
|---|---|---|---|---|---|
| Adhesive) composition (in terms of solid mass) | polyamide-imide resin 1 | | | | |
| | polyamide-imide resin 2 | | 60 | 60 | 60 |
| | polyamide-imide resin 3 | | | | |
| | polyamide-imide resin 4 | | | | |
| | polyamide-imide resin 5 | | | | |
| | polyamide-imide resin 6 | | | | |
| | polyamide-imide resin 7 | | | | |
| | polyamide-imide resin 8 | | | | |
| epoxy resin | YDF8170C | | | 19 | 19 |
| | jER152 | | | | |
| | YDCN700-10 | | 19 | | |
| phosphorus-type flame retardant | BCA | | 21 | 11 | |
| | SPH-100 | | | 10 | 21 |
| | phosphorus content | | 2.1 | 2.3 | 2.5 |
| | processing ability at low temperature | | x | ○ | x |
| | adhesive property | | ○ | ○ | ○ |
| | heat resistance to solder | | ○ | ○ | ○ |
| | flame retardancy | | ○ | ○ | ○ |
| | HAST | | ○ | ○ | ○ |

YDF8170C: epoxy resin of a bisphenol type manufactured by Nippon Steel & Sumikin Chemical (liquid at 25° C.)
jER512: epoxy resin of a phenol novolak type manufactured by Mitsubishi Chemical (liquid at 25° C.)
YDCN700-10: epoxy resin of a cresol novolak type manufactured by Nippon Steel & Sumikin Chemical (solid at 25° C.)
BCA: phosphinic acid derivative of a phenanthrene type manufactured by Sanko
SPH-100: phosphazene compound manufactured by Otsuka Chemical Co., Ltd.

As will be noted from Table 2, the adhesive compositions of Examples 1 to 11 satisfying the conditions of the present invention showed excellent results in terms of the processing ability at low temperature, adhesive property, heat resistance to solder, flame retardancy, and HAST. On the contrary, in Comparative Examples 1 to 3 using the polyamide-imide resins which do not satisfy the conditions of the present invention, in Comparative Examples 4 and 5 wherein the compounding rate of the epoxy resin to the polyamide-imide resin is out of the scope of the present invention, in Comparative Examples 6 and 7 wherein the compounding rate of the phosphorus-type flame retardant to a total of the polyamide-imide resin and the epoxy resin is out of the scope of the present invention, in Comparative Example 8 using more than the predetermined amount of the epoxy resin being solid at 25° C., and in Comparative Example 9 using more than the predetermined amount of reactive phosphorus-type flame retardant, the result for any of the properties was not satisfactory.

INDUSTRIAL APPLICABILITY

Since the adhesive composition according to the present invention is excellent in the processing ability at low temperature, adhesive property, heat resistance, flame retardancy and electric insulation, it is particularly suitable for adhesion of a copper foil to a polyimide film in a flexible copper-clad laminate of a flexible printing wiring board. Accordingly, the present invention is very useful.

The invention claimed is:

1. An adhesive composition comprising a polyamide-imide resin, an epoxy resin, and a phosphorus-containing flame retardant,
wherein the polyamide-imide resin comprises a constitution unit derived from a polycarboxylic acid having an aromatic group as an acid ingredient, wherein a rate thereof in the total acid ingredient is 90 mol % or higher, and the polyamide-imide resin does not comprise acrylonitrile-butadiene rubber as a polymerization component, and
wherein the adhesive composition has the following characteristics (A) to (F):
(A) 15 to 40 parts by mass of the epoxy resin is compounded to 85 to 60 parts by mass of the polyamide-imide resin;
(B) a glass transition temperature of the polyamide-imide resin is 250° C. or higher;
(C) an acid value of the polyamide-imide resin is 50 to 150 mg KOH/g;
(D) the epoxy resin is liquid at 25° C.;
(E) 400/21 to 60 parts by mass of the phosphorus-containing flame retardant is compounded to 100 parts by mass in total of the polyamide-imide resin and the epoxy resin; and
(F) 50% by mass or more of the phosphorus-containing flame retardant is 10-benzyl-10-hydro-9-oxa-10-phosphaphenanthrene-10-oxide.

2. The adhesive composition according to claim 1, wherein the polyamide-imide resin having an aromatic group as an acid ingredient is trimellitic acid anhydride.

3. The adhesive composition according to claim 1, wherein the adhesive composition is used for adhering a copper foil with a polyimide film.

4. The adhesive composition according to claim 1, wherein the rate of the constitution unit derived from the polycarboxylic acid having an aromatic group in the total acid ingredient is 100 mol %.

5. A copper foil equipped with an adhesive layer, wherein the adhesive layer comprises the adhesive composition according to claim 1.

6. The copper foil equipped with the adhesive layer according to claim 5, wherein an amount of residual solvent in the adhesive layer of the copper foil equipped with the adhesive layer in a state of B stage is 5.0 to 16.0% by mass.

7. The copper foil equipped with the adhesive layer according to claim 5, wherein the foil can be laminated at a laminating temperature of 150° C. or lower.

8. A double-sided flexible copper-clad laminate, wherein the laminate is prepared by adhering the copper foil equipped with the adhesive layer according to claim 5 to each side of a polyimide film.

9. A flexible printed wiring board, comprising the double-sided flexible copper-clad laminate according to claim 8.

* * * * *